(12) United States Patent
Bayan et al.

(10) Patent No.: US 7,859,090 B2
(45) Date of Patent: Dec. 28, 2010

(54) DIE ATTACH METHOD AND LEADFRAME STRUCTURE

(75) Inventors: Jaime A. Bayan, San Francisco, CA (US); Nghia Thuc Tu, San Jose, CA (US); Lim Fong, Melaka (MY); Chan Peng Yeen, Melaka (MY)

(73) Assignee: National Semiconductor Corporation, Santa Clara, CA (US)

( * ) Notice: Subject to any disclaimer, the term of this patent is extended or adjusted under 35 U.S.C. 154(b) by 22 days.

(21) Appl. No.: 12/549,324

(22) Filed: Aug. 27, 2009

(65) Prior Publication Data

US 2009/0315161 A1    Dec. 24, 2009

Related U.S. Application Data

(62) Division of application No. 11/372,481, filed on Mar. 8, 2006, now Pat. No. 7,598,122.

(51) Int. Cl.
| | |
|---|---|
| H01L 23/495 | (2006.01) |
| H01L 23/48 | (2006.01) |
| H01L 23/52 | (2006.01) |
| H01L 23/28 | (2006.01) |

(52) U.S. Cl. ................... 257/673; 257/676; 257/735; 257/775; 257/787; 257/23.047; 257/E23.048; 257/E23.052

(58) Field of Classification Search ............... 257/673, 257/676, 735, 775, 787, E23.047, E23.048, 257/E23.052
See application file for complete search history.

(56) References Cited

U.S. PATENT DOCUMENTS

| | | | |
|---|---|---|---|
| 5,816,158 A | 10/1998 | Ross | |
| 6,100,594 A * | 8/2000 | Fukui et al. | 257/777 |
| 6,774,659 B1 | 8/2004 | Chiang | |
| 6,965,159 B1 * | 11/2005 | Miks et al. | 257/676 |
| 6,975,022 B2 * | 12/2005 | Sakamoto et al. | 257/676 |
| 7,001,798 B2 * | 2/2006 | Yamaguchi | 438/114 |
| 7,095,096 B1 * | 8/2006 | Mostafazadeh | 257/666 |
| 2004/0089929 A1 | 5/2004 | Chiu et al. | |

* cited by examiner

*Primary Examiner*—Walter L Lindsay, Jr.
*Assistant Examiner*—Ron Pompey
(74) *Attorney, Agent, or Firm*—Beyer Law Group LLP

(57) ABSTRACT

In one aspect of the invention, a method of attaching a semiconductor die to a microarray leadframe is described. The method comprises stamping an adhesive onto discrete areas of the microarray leadframe using a multi-pronged stamp tool. The adhesive is applied to the leadframe as a series of dots, each dot corresponding to an associated prong of the stamping tool. In some embodiments the adhesive used to attach the semiconductor die to a leadframe is a black epoxy based adhesive material. In an apparatus aspect of the invention, lead traces in a microarray leadframe are arranged to have tails that extend beyond their associated contact posts on the side of the contact post that is opposite a wire bonding region such that such lead traces extends on two opposing sides of their associated contact posts. The tails do not attach to other structures within the lead frame (such as a die attach structure). The width of at least some of these tailed lead traces in a region that overlies their associated contact post is narrower than their associated contact post. Thus, these narrowed lead traces have extensions that extend beyond their associated contact posts. The extensions provide additional surface area that gives an adhesive applied to the narrowed lead trace (as for example by stamping) room to bleed (flow) along the top surface of the lead trace on both sides of the associated contact pad.

8 Claims, 5 Drawing Sheets

DIE ATTACH METHOD AND LEADFRAME STRUCTURE

CROSS-REFERENCE TO RELATED APPLICATIONS

This application is a divisional of U.S. patent application Ser. No. 11/372,481, titled DIE ATTACH METHOD AND LEADFRAME STRUCTURE, filed on Mar. 8, 2006, which is incorporated in its entirety for all purposes herein by reference.

BACKGROUND OF THE INVENTION

The present invention relates generally to the packaging of integrated circuits in leadframe based microarray packages.

There are a number of conventional arrangements for packaging integrated circuits. Many packaging techniques use a leadframe that has been stamped or etched from a metal (typically copper) sheet to provide electrical interconnects to external devices. One relatively recently developed packaging style, which is sometimes referred to as a leadframe based microarray package is generally illustrated in FIG. 1(c). In a microarray package, the leadframe typically includes an array of contact posts 22 that are exposed on the bottom surface of the package and lead traces 24 that may or may not be exposed at the bottom surface of the package. A die mounted on the leadframe is wire bonded (or otherwise electrically connected) to the lead traces, which serve as electrical connectors between the bonding wires and the contact posts 22. Often the microarray package will also have a die support structure 26 that supports the die. The die may be attached to the leadframe via a variety of different techniques. By way of example, one approach contemplates applying a die attach film (tape) to the top side of the leadframe.

Microarray packages have a number of potential advantages. For example, they are relatively low cost, they may be configured to be pin compatible with conventional BGA packages and they allow a relatively large number of contacts for a given package size. Also, since the lead traces permit "routing" of signals to contact pads located under the die, a package with a relatively smaller footprint may be used for a given die size and pin count as compared to many other leadframe based packages.

Given their many advantages, microarray packages in general have recently generated a great deal of interest within the semiconductor industry. Although existing techniques for fabricating microarray leadframes and for packaging integrated circuits using microarray leadframe technology work well, there are continuing efforts to develop even more efficient designs and methods for packaging integrated circuits using microarray leadframe technology.

SUMMARY OF THE INVENTION

In one aspect of the invention, a method of attaching a semiconductor die to a microarray leadframe is described. The method comprises stamping an adhesive onto discrete areas of the microarray leadframe using a multi-pronged stamp tool. The adhesive is applied to the leadframe as a series of dots, each dot corresponding to an associated prong of the stamping tool. At least some of the adhesive dots are placed on lead trace portions of the microarray leadframe and at least some other of the adhesive dots are placed on the die attach structure of the leadframe. A die is then attached to the microarray leadframe using the adhesive.

In some embodiments the adhesive used to attach the semiconductor die to a leadframe is a black epoxy based adhesive material. After attachment, the leadframe is electrically connected to the die (as for example, by wire bonding). An encapsulant cap is then formed over the leadframe and die while leaving bottom surfaces of leadframe's contact posts exposed to provide electrical contacts for the packaged die.

The described processes are preferably performed on leadframes having a large number of device areas. Typically, the leadframe panel will have at least one two dimensional array of adjacent device areas. The stamping tool is typically arranged to apply adhesive to a single device area, although in some embodiments it may be arranged to simultaneously apply adhesive to a plurality of device areas (or a portion of a device area). Generally, the stamping operation is repeated until an adhesive has been applied to each of the device areas on the leadframe panel. An advantage of the described stamping approach is that it can readily accommodate a die attach throughput of over 6000 dice per hour, which is well above the attachment rates that are attainable using die attach film.

In an apparatus aspect of the invention, a new microarray leadframe structure is described. Generally, the microarray leadframe is formed as part of a panel having a plurality of device areas. Each device area includes an array of contact posts suitable for forming contact pads, and a plurality of lead traces. The posts are arranged in a plurality of rows and each lead trace is integrally formed with an associated contact post. The top surfaces of the lead traces are substantially co-planar with the top surface of the leadframe and the bottom surfaces of the lead traces are preferably recessed relative to a bottom surface of the leadframe. The bottom surfaces of the contact posts are substantially co-planar with the bottom surface of the leadframe. The new microarray structure is different than other microarray leadframes in that at least some of the lead traces have tails that extend beyond their associated contact posts on the side of the contact post that is opposite a wire bonding region such that such lead traces extends on two opposing sides of their associated contact posts. The tails do not attach to other structures within the lead frame (such as a die attach structure). The width of at least some of these tailed lead traces in a region that overlies their associated contact post is narrower than their associated contact post. Thus, these narrowed lead traces have extensions that extend beyond their associated contact posts. The extensions provide additional surface area that gives an adhesive applied to the narrowed lead trace (as for example by stamping) room to bleed (flow) along the top surface of the lead trace on both sides of the associated contact pad.

BRIEF DESCRIPTION OF THE DRAWINGS

The invention, together with further objects and advantages thereof, may best be understood by reference to the following description taken in conjunction with the accompanying drawings in which.

It is to be understood that, in the drawings, like reference numerals designate like structural elements. Also, it is understood that the depictions in the figures are diagrammatic and not to scale.

DETAILED DESCRIPTION OF THE PREFERRED EMBODIMENTS

One aspect of the present invention relates generally to the use of a stamping process to apply adhesive to microarray leadframes. In another aspect of the invention, a new microarray leadframe structure is described.

As described above, in a microarray package, the leadframe typically includes an array of contact posts 22 that are exposed on the bottom surface of the package and lead traces 24. Preferably, the lead traces are not exposed at the bottom surface of the package. A die mounted on the leadframe is wire bonded (or otherwise electrically connected) to the lead traces, which serve as electrical connectors between the bonding wires and the contact posts 22. Often the microarray package will also have a die support structure 26 that supports the die.

Figure 5A:
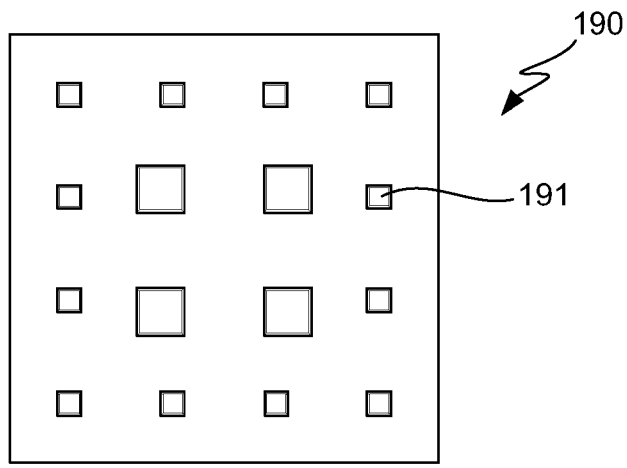
FIG. 5(a) is a diagrammatic bottom view of a 16 tined stamp tool suitable for applying adhesive to a microarray leadframe.
Figure 5B:
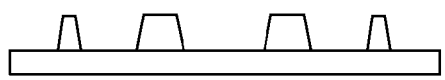
FIG. 5(b) is a side view of the stamp tool illustrated in FIG. 5(a).
Figure 5C:
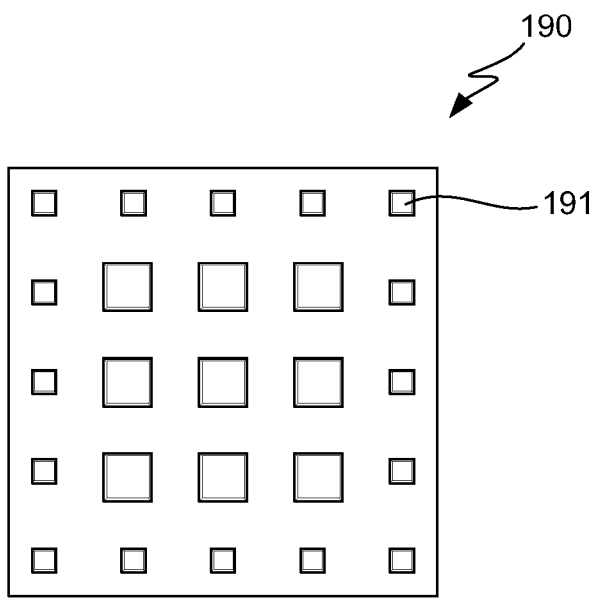
FIG. 5(c) is a diagrammatic bottom view of a 25 tined stamp tool suitable for applying adhesive to a microarray leadframe.
Figure 5D:
FIG. 5(d) is a side view of the stamp tool illustrated in FIG. 5(c).

In order to secure a die to the leadframe an adhesive is applied to the leadframe using a stamping process. More specifically, a multi-pronged stamping tool (see, e.g., FIGS. 5(a) and 5(b)) is used to apply adhesive to the lead frame. The prongs 191 of the stamping tool 190 are arranged to engage the lead frame. Some of the prongs 191 engage the lead traces 24 and others engage part of the die attach structure 26. The shapes, dimensions and spacing of the prongs as well as the number of prongs provided may be varied to meet the needs of a particular leadframe application. In the embodiment shown in FIGS. 5(a-b), sixteen prongs are provided, while in the embodiment shown in FIGS. 5(c-d), twenty-five prongs are provided. In other embodiments as few as four to well over a hundred prongs may be provided.

Figure 3A:
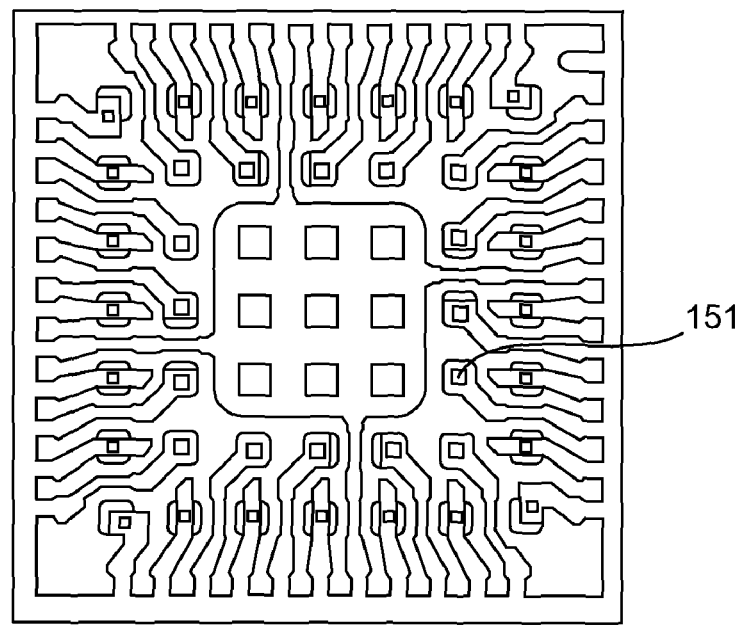
FIG. 3(a) is a diagrammatic top view of the single leadframe device area illustrated in FIG. 2(c) after an adhesive has been applied to the leadframe using a 49 tined stamp tool.

To apply an adhesive, the prongs (tines) of a stamp tool are dipped in a pool of adhesive such that so adhesive collects on the tine tips. The stamping tool is then moved into place over a device area within the leadframe panel and pressed into contact with the leadframe thereby leaving an array of adhesive "dots" on the lead frame. One such adhesive dot pattern is illustrated in FIG. 3(a). However, it should be appreciated that the appropriate dot pattern may vary with the design of the lead frame. In order to facilitate standardization, in some preferred embodiments, the tines are evenly spaced in an array that overlies the contact posts.

Preferably the stamp tool is arranged such that its footprint is generally slightly smaller than the footprint of the die to be attached to the lead frame (although this is not a requirement and in various embodiments, the footprint of the stamp tool could be slightly larger or considerably smaller than the footprint of the die). In many applications, the number of tines on a stamping tool will correspond to the number of contact posts in the microarray leadframe, although again, this is not in any way a requirement and the stamping tool may have either more or less tines than the microarray leadframe has contact pads.

After the adhesive is applied to a leadframe, the stamping tool is again dipped in the adhesive pool and the process is repeated for the next device area. The same dipping and stamping process is then repeated until the adhesive has been applied to all of the devices areas on a leadframe strip or panel. It should be appreciated that typical microarray leadframe strips and panels may have virtually any number of device areas. By way of example, between ten and several hundred device areas per strip or panel are common in current microarray lead frame panels. As the technology develops, it is expected that these numbers may increase even further. The stamp tool may be designed to apply adhesive to a single device area at a time or a plurality of device areas. The stamping tool could also be designed so that more than one stamping operation is required to apply adhesive to a single device area, although this approach is generally significantly less preferred.

After the adhesive is applied, a die is placed on the lead frame. When the adhesive sets, it firmly secured the die in place. The dice can be placed immediately after the adhesive is applied or after a few stamping operations have been performed. With the described stamping process, throughputs of 6000 dice per hour and greater can readily be attained using a single adhesive stamping machine.

After the adhesive has set, the die may be electrically connected to the lead frame by wire bonding or other suitable electrical interconnection techniques. After the die has been electrically connected to the lead frame, an encapsulant cap may be placed over the die, the bonding wires and the upper surfaces of the lead frame by conventional encapsulation techniques such as molding, dispensing, screen or stencil printing etc. Typically an adhesive tape is applied to bottom surface of the lead frame strip 1. The adhesive tape is typically used through at least the encapsulation process. The adhesive tape provides structural support to the lead frame during handling operations and helps prevent molding material from covering the bottom surfaces of the contact posts during the encapsulation process.

Any of a wide variety of adhesives may be used so long as they are compatible with semiconductor devices and lead frames in general. By way of example, a variety of conventional epoxies may be used as the die attach adhesive. Typically, the lead traces are relatively narrow. Thus, when an adhesive is applied by a stamping operation, there is some risk that some of the adhesive will drip along the edges of the leadframe. Sometimes this can cause a cosmetic defect, even though the device is fully functional. The epoxy that drips along the side of a lead frame appears as a cosmetic defect because most epoxies are relatively clear or light colored, whereas most encapsulants used in semiconductor materials are black. Therefore, any epoxy that is exposed on the bottom surface of the package is a different color than the encapsulant and therefore appears as a cosmetic defect even though the epoxy has no adverse impact on the performance of the device. The potential cosmetic problem can be ameliorated by using pigments to provide a black adhesive (e.g. epoxy). Preferably the adhesive has a color that when fully dried and cured, closely matches the color of the encapsulant. Of course, if other color encapsulants are used, the adhesive can be colored to match the color of the specific encapsulant used.

As microarray leadframe devices get smaller and/or incorporate higher pin counts, electrical interference between adjacent leads becomes a bigger problem. Generally, its desirable to maintain a reasonable spacing between independent lead components. In some embodiments, portions of a lead trace 24 adjacent a contact post 22 are constricted to form a neck region 25 in order to help maintain adequate spacing between a contact pad and adjacent lead traces. Similar neck regions 27 may also be found in the bars 28 used to support the die attach structure 26.

Figure 2A:
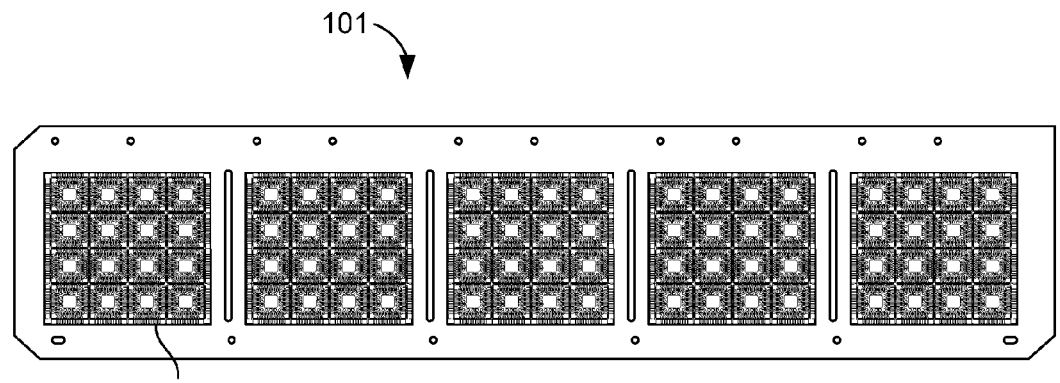
FIG. 2(a) is a diagrammatic top view of another leadframe strip or panel having a plurality of two-dimensional arrays of device areas defined therein.
Figure 2B:
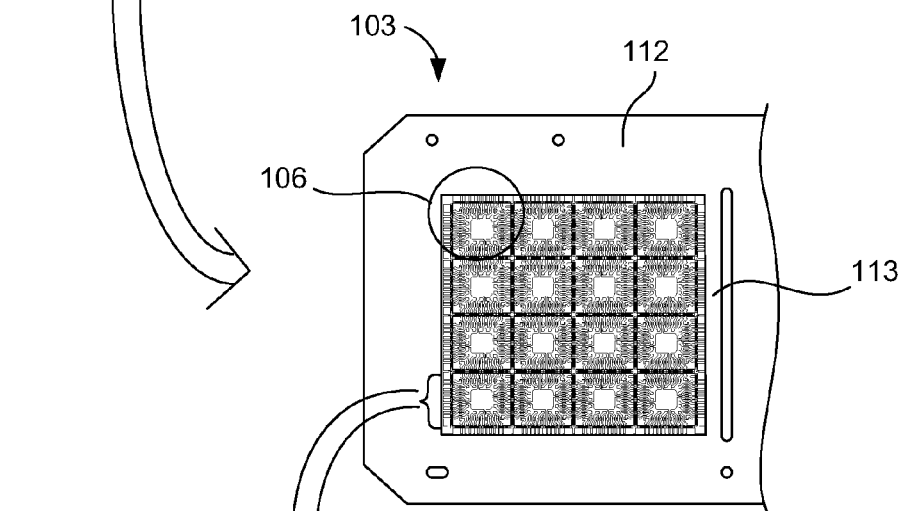
FIG. 2(b) is a diagrammatic enlarged top view of the leadframe strip illustrated in FIG. 2(a) showing a single one of the two dimensional arrays of device areas.
Figure 2C:
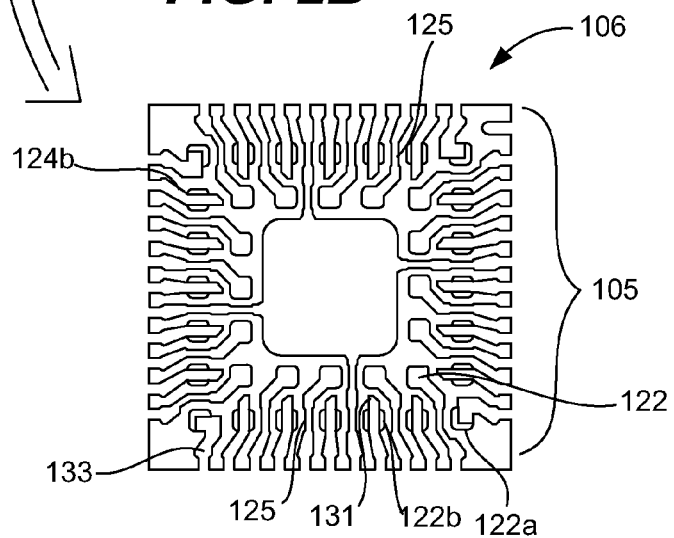
FIG. 2(c) is a diagrammatic enlarged top view of the leadframe that constitutes a single device area within the two dimensional array of device areas illustrated in FIG. 2(b).

Referring next to FIGS. 2(a)-2(c), an improved lead frame design in accordance with another aspect of the invention will be described. FIG. 2(a) is a diagrammatic top view of a lead-frame strip suitable for use in packaging integrated circuits. A lead-frame strip (panel) 101 is formed from a suitable conductive material. Typically the lead frame strip is formed from a metallic material such as copper, copper alloy, aluminum, etc., although this is not a requirement. In the illustrated embodiment, the leadframe strip 101 has a number of sections 103 that each include a two-dimensional array 103 of device areas 105. Each device area 105 is configured for use as a lead frame 106 in a single microarray IC package. FIGS. 2(b) and 2(c) successively illustrate more details of the lead frame strip 101. More specifically, FIG. 2(b) illustrates a single section 103 that includes a two dimensional array of device areas 105. A matrix of tie bars 107 divides the section 103 into the 2-dimensional array of device areas. The tie bars in turn are supported by the rails 112 and cross bars 113 of the lead frame strip.

FIG. 2(c) illustrates details of the lead frame 106 associated with a single device area 105. As best seen in FIG. 2(c), each device area 105 has a number of lead traces 124, a number of contact posts 122, a die attach pad 126 and die support bars 127. The lead traces and die pad support bars 127 are supported at one end by the tie bars 107. The second end of the die pad support bars 127 support the die attach pad 126. In other embodiments, the die pad support bars would carry any other die support structures that are provided. In the illustrated embodiment, portions of the die attach pad are half etched or otherwise thinned from the bottom surface to define contact posts at suitable locations below the die attach pad. The contact posts that are part of the die attach pad are evenly spaced within the contact pad array.

Each contact post 122 extends to the bottom surface of the lead-frame 101 to provide a conductive contact pad 216 at the bottom surface of the lead frame. The lead traces 124 are etched, half-etched, or otherwise thinned from the bottom surface so that they are recessed relative to the bottom surface of the lead frame. With this arrangement, when the microarray lead frame in incorporated into a package and encapsulated, only the contact pads 216 are exposed at the bottom surface of the package. The lead traces also include enlarged bonding regions 133 that serve as landings for the bonding wires that electrically connect the lead frame to the die.

The illustrated contact posts (and thus the contact pads) have generally square footprints with rounded corners. However it should be appreciated that the footprint geometry of the contact pads may be widely varied. By way of example, circular, oval and substantially rectangular contact pads work well.

Like in the previously discussed embodiment, some of the lead traces 124 that extend between a pair of adjacent contact posts have constricted neck regions 125 in order to help maintain adequate spacing between the contact pads and the adjacent lead traces. Additionally, in order to further reduce inductive coupling, some portions of some of the contact posts may be etched, half etched or otherwise thinned from the top surface of the lead frame. For example, portions of contact posts 122(a) and 122(b) are half etched. It should be apparent that the entire contact posts 122(a) and 122(b) are not half etched. Rather, in regions where the corresponding lead traces overlie the contact post, the resulting structure will have the full thickness of the leadframe.

Figure 1A:
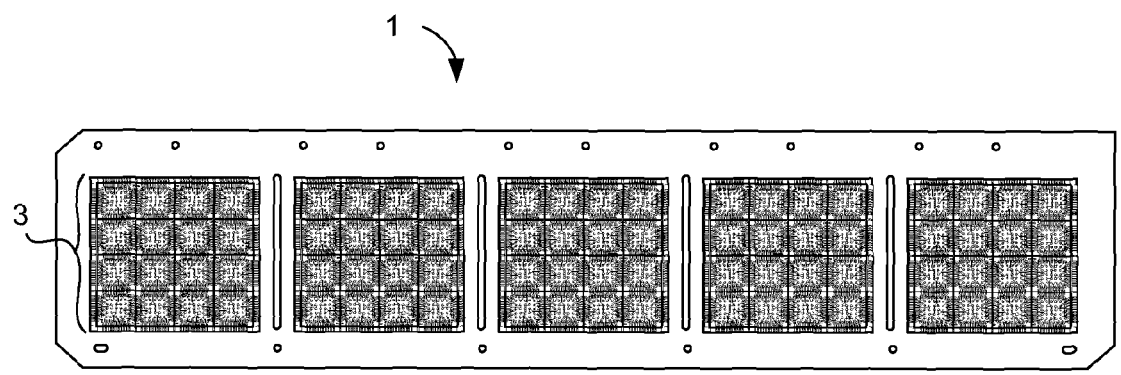
FIG. 1(a) is a diagrammatic top view of a leadframe strip or panel having a plurality of two-dimensional arrays of device areas defined therein.
Figure 1B:
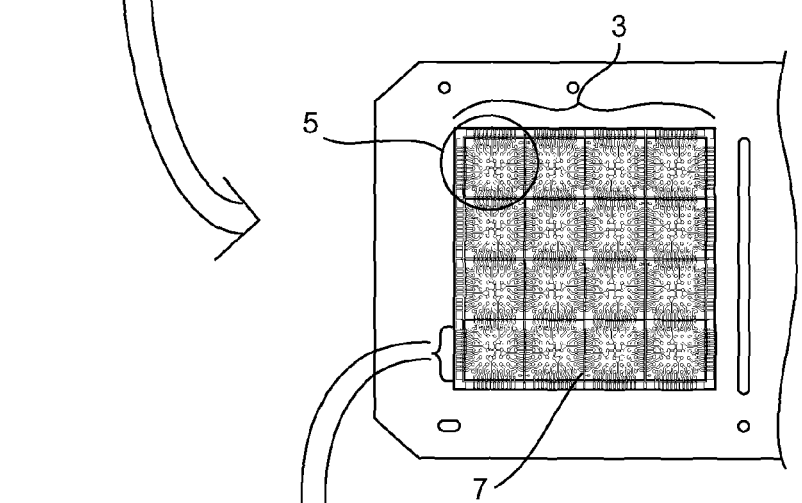
FIG. 1(b) is a diagrammatic enlarged top view of the leadframe strip illustrated in FIG. 1(a) showing a single one of the two dimensional arrays of device areas.
Figure 1C:
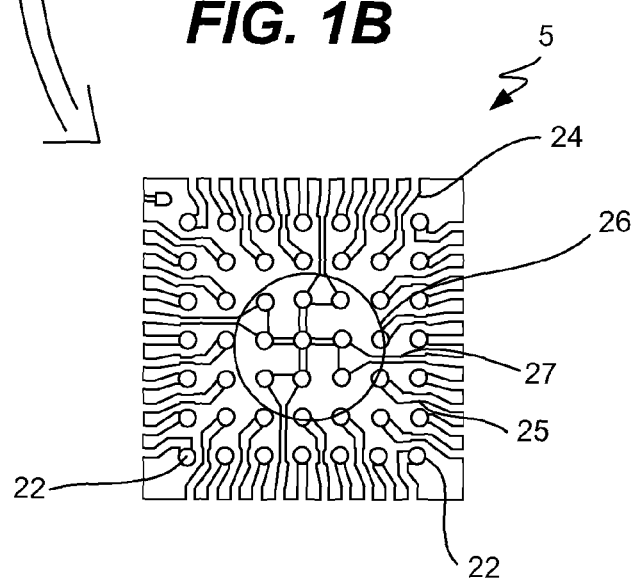
FIG. 1(c) is a diagrammatic enlarged top view of the leadframe that constitutes a single device area within the two dimensional array of device areas illustrated in FIG. 1(b).

In the embodiment illustrated in FIG. 1(c), the contact posts 22 carried by lead traces are formed at the distal end of their associated lead traces. In contrast, some of the lead traces (e.g. lead trace 124(b)) shown in FIG. 2(c) have tails (fingers) 131 that extend beyond their associated contact post 122. The contact post 122(b) associated with lead trace 124(b) is positioned between a couple of adjacent contact posts and is half etched thereby dictating that the lead trace 124(b) is narrower than its associated contact post. Although this structure helps reduce inductive coupling, when adhesive is applied to the lead trace 124(b) in a region that overlies the contact post 122(b), (which is a preferred approach in the above described stamping operation), our experience has been that the adhesive is more likely to drip over the sides of the lead trace. Tails 131 are provided to reduce the probability of dripping. More particularly, without a tail 131 there is little room for the adhesive to flow along a narrow lead trace segment without dripping since it would only be able to wick along the lead trace in one direction. The tails 131 extend inward and thus any adhesive bleeding can move in two directions along the lead trace which reduces the probability of dripping.

In the illustrated embodiment, the tails 131 are only provided on the lead traces associated with the outer ring of contact posts that extend between a pair of adjacent lead traces. However, in alternative embodiments, if the design dictates, appropriate fingers can be provided on other lead traces as well. In the illustrated embodiment, the fingers are not necessary for the other lead traces because the regions of the contact posts that are exposed on the upper surface of the lead frame are sufficiently large to accommodate the adhesive dots that are applied thereto.

When packaging integrated circuit chips using the described lead frame, the die attach adhesive may be applied to the lead frame using a multi-pronged stamping tool that dispenses a plurality of dots as described above. Of course, other die attach mechanism, including dispensing adhesives and using die attach tapes can be used in other embodiments. In the described embodiment, some of the prongs apply adhesive dots to the lead traces in regions over their associated contact posts and other prongs apply adhesive dots to the die attach pad in regions over their associated contact posts. FIG. 3(a) illustrates a representative adhesive dot pattern that results from such a stamping operation. Of course, in alternative embodiments, the stamping tool may be customized to apply adhesive in other or larger regions of the lead frame.

Figure 3B:
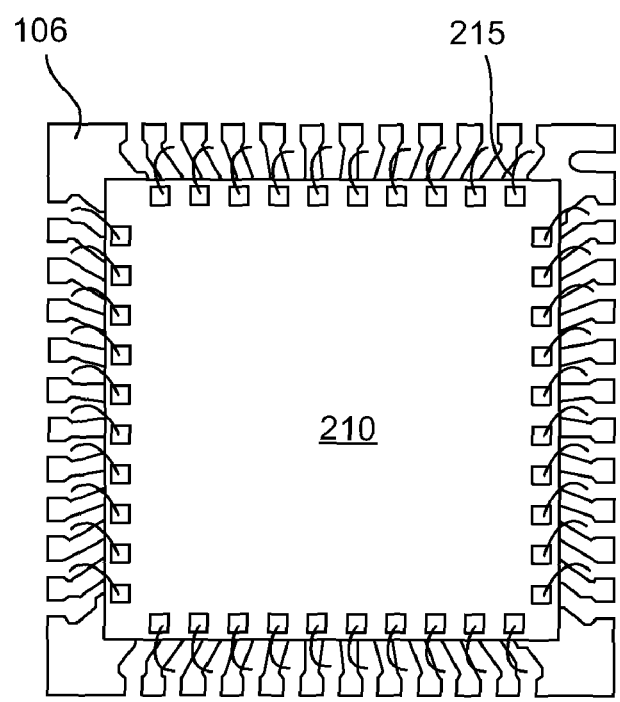
FIG. 3(b) is a diagrammatic top view of the single leadframe device area illustrated in FIG. 3(a) after a die has been secured to the leadframe.

After the adhesive has been applied, the die is placed on the lead frame and secured thereto by the adhesive. FIG. 3(b) illustrates a die placed on the lead frame of FIG. 3(a). After the die has been positioned, the die may be electrically connected to the lead frame by wire bonding or other appropriate electrical interconnection techniques. After the electrical connection, an encapsulant may be used to encapsulate the die, bonding wires and parts of the lead frame while leaving the bottom surfaces of the contact posts (i.e., the contact pads) exposed. Typically, the encapsulant would be formed as a cap over a section 103 of the lead frame panel thereby covering a two dimensional array of device areas. However, in alternative embodiments, the device areas may be individually encapsulated. The encapsulant caps may be formed by any suitable technique including molding, dispensing and screening operations.

Figure 4:
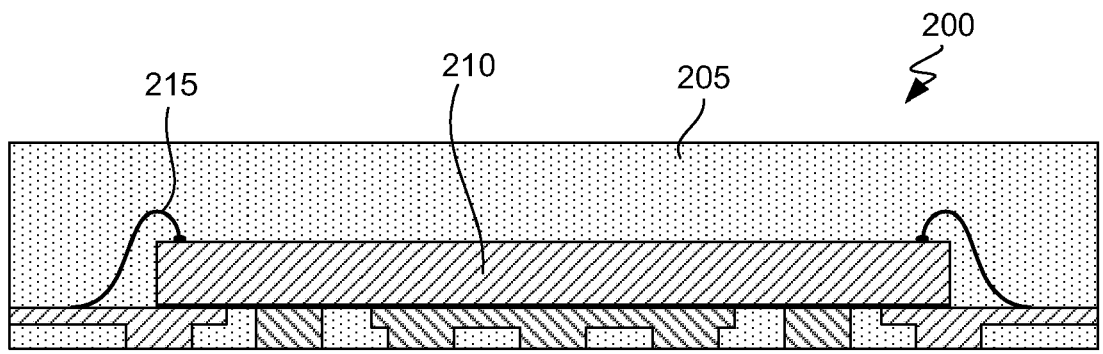
FIG. 4 is a side view of a packaged integrated circuit that includes illustrated a lead frame as illustrated in FIG. 3(b).

After the encapsulation and any other desired panel level processing steps are completed, the devices may be singulated. By way of example, in the embodiment shown in FIG. 2b, the devices may be singulated by cutting along the tie bars 107. A singulated integrated circuit package 200 incorporating the lead frame 106 of FIG. 2(c) is illustrated in FIG. 4. As seen therein, the contact pads (i.e., the bottom surfaces of the contact posts) are substantially co-planar with the bottom surface of the package. The top surfaces of the lead traces are substantially co-planar with the top surface of the leadframe and the bottom surfaces of the lead traces are recessed relative to a bottom surface of the leadframe and the package. Thus, the encapsulant 205 flows underneath the lead traces so that the lead traces are not exposed on the bottom surface of the package. The new microarray structure is different than other microarray leadframes in that at least some of the lead traces have tails 131 that extend beyond their associated contact posts on the side of the contact post that is opposite a wire bonding region such that such lead traces extends on two opposing sides of their associated contact posts. The tails do not attach to other structures within the lead frame. As seen in FIG. 2(c), the width of the tailed lead traces in a region that overlies their associated contact post is narrower than their associated contact post. The extensions provide additional surface area that gives an adhesive applied to the narrowed lead trace (as for example by stamping) room to bleed (flow) along the top surface of the lead trace on both sides of the associated contact pad. The encapsulant 205 covers the die 210, the bonding wires 215 and the majority of the lead frame 106 while leaving the contact pads 216 exposed on the bottom surface of the package. Typically, the contact pads 216 are arranged in a rectangular two dimensional array (e.g., 2×2, 4×4, 5×5, 6×6, 7×7) although in various embodiments, a variety of other pinnout patterns (e.g., 2 or more rings of contacts) may be provided as well.

Although only a few embodiments of the invention have been described in detail, it should be appreciated that the invention may be implemented in many other forms without departing from the spirit or scope of the invention. In some embodiments. Therefore, the present embodiments are to be considered as illustrative and not restrictive and the invention is not to be limited to the details given herein, but may be modified within the scope and equivalents of the appended claims.

What is claimed is:

1. A microarray leadframe panel having a plurality of device areas, each device area including an array of contact posts suitable for forming contact pads, and a plurality of lead traces, the posts being arranged in a plurality of rows and each lead trace being integrally formed with an associated contact post, wherein:

top surfaces of the lead traces are substantially co-planar with a top surface of the leadframe;

bottom surfaces of the lead traces are recessed relative to a bottom surface of the leadframe;

bottom surfaces of the contact posts are substantially co-planar with the bottom surface of the leadframe; and at least some of the lead traces extend beyond their associated contact posts on two opposing sides of their associated contact posts and have a width in an overlying region of their associated contact post that is narrower than their associated contact post.

2. A packaging panel comprising:

a microarray leadframe panel as recited in claim 1;

a plurality of semiconductor dice, each die being attached to an associated die attach area;

bonding wires that electrically connect the dice to the leadframe panel; and at least one encapsulant cap formed over the leadframe and dice, the at least one encapsulant cap being arranged to leave bottom surfaces of the contact posts exposed to provide electrical contacts for the packaged dice.

3. A microarray leadframe panel as recited in claim 2 wherein the dice are secured to the leadframe by a black epoxy based adhesive material.

4. A microarray leadframe panel as recited in claim 3 wherein the adhesive material is applied as a series of dots in a stamping operation.

5. A microarray package comprising:

a microarray leadframe including an array of contact posts and a plurality of lead traces, the posts being arranged in a plurality of rows and each lead trace being integrally formed with an associated contact post, wherein top surfaces of the lead traces are substantially co-planar with a top surface of the leadframe, bottom surfaces of the lead traces are recessed relative to a bottom surface of the leadframe, bottom surfaces of the contact posts form contact pads that are substantially co-planar with the bottom surface of the leadframe, and at least some of the lead traces extend beyond their associated contact posts on two opposing sides of their associated contact posts and have a width in an overlying region of their associated contact post that is narrower than their associated contact post;

a die mounted on the top surface of the leadframe, wherein I/O pads on the die are electrically connected to associated lead traces; and an encapsulant that encapsulates at least portions of the lead frame and the die while leaving bottom surfaces of the contact posts exposed on a bottom surface of the microarray package to provide electrical contacts for the microarray package.

6. A microarray package as recited in claim 5 further comprising a plurality of bonding wires, each bonding wire arranged to electrically couple an associated I/O pad to an associated lead trace, wherein the encapsulant further encapsulates the bonding wires.

7. A microarray package as recited in claim 5 wherein at least some of the lead traces that extend beyond their associated contact posts on two opposing sides further include a bonding wire landing portion positioned on a first side of the associated contact post and a tail portion positioned on a second side of the contact post, wherein the tail portions each have a width that is narrower than their associated contact post.

8. A microarray package as recited in claim 5 wherein the die is secured to the leadframe by a black epoxy based adhesive material.

* * * * *